GUARD RING FOR SCHOTTKY BARRIER DEVICES

Filed Oct. 19, 1967

INVENTORS M. P. LEPSELTER
S. M. SZE
BY
Sylvan Sherman
ATTORNEY

United States Patent Office 3,541,403
Patented Nov. 17, 1970

3,541,403
GUARD RING FOR SCHOTTKY BARRIER DEVICES

Martin P. Lepselter, New Providence, and Simon M. Sze, Berkeley Heights, N.J., assignors to Bell Telephone Laboratories, Incorporated, Murray Hill and Berkeley Heights, N.J., a corporation of New York Filed Oct. 19, 1967, Ser. No. 676,509
Int. Cl. H01l *9/00, 15/00*
U.S. Cl. 317—234 8 Claims

ABSTRACT OF THE DISCLOSURE

This application discloses guardring structures adapted for use with Schottky barrier devices to decrease the leakage current and increase the reverse breakdown voltage. In particular, Schottky barrier devices, including diodes and particle detectors, are provided with p-n junction and metal-insulator-semiconductor (MIS) guardrings. In addition, a Schottky barrier device having a closure guardring is also disclosed.

This invention relates to Schottky barrier devices having guardrings to reduce leakage current and to increase reverse breakdown voltage.

BACKGROUND OF THE INVENTION

Because they can operate at high speeds and high frequencies, Schottky barrier devices are potentially useful in a variety of applications. Such devices typically comprise an appropriately formed metal-to-semiconductor interface. (See, for example, D. Kahng and M. P. Lepselter, "Planar Epitaxial Silicon Schottky Barrier Diodes," 19 B.S.T.J. 1525, 1965.) The main feature of such devices is that they behave as rectifying contacts which have the properties of an ideal step junction. The high speed of these devices arises from the fact that only majority carriers take part in the rectification process. Thus, they are typically faster than corresponding p-n junction devices, whose switching speed is limited by minority carrier storage. Because of this high speed, Schottky devices are particularly promising for use as computer diodes, high performance varactors, logarithmic converters, photon detectors and microwave oscillators.

The performance of prior art Schottky barrier devices, however, has fallen significantly short of theoretical predictions. For example, their reverse bias leakage current is typically three to four orders of magnitude greater than that theoretically attainable. In addition, the prior art devices do not exhibit a well-defined bulk breakdown, but rather begin breaking down at a reverse bias voltage less than one-third the theoretical value. Consequently, prior art Schottky barrier devices cannot be used in many of the applications in which they are potentially advantageous.

SUMMARY OF THE INVENTION

In accordance with the present invention, an improved Schottky barrier device is constructed by circumscribing the edge of the Schottky barrier with a specially designed guardring adapted to prevent current from flowing across the edge portion of the barrier at reverse bias voltages. In particular, it has been discovered that the use of such a guardring significantly decreases the leakage current, increases the reverse breakdown voltage, and produces bulk breakdown.

BRIEF DESCRIPTION OF THE DRAWINGS

The invention and its objects and advantages will be more clearly understood from the following detailed description, taken in conjunction with the drawing in which.

Similar reference characters are applied to similar elements throughout the drawings.

DETAILED DESCRIPTION OF THE DRAWINGS

Figure 1A:
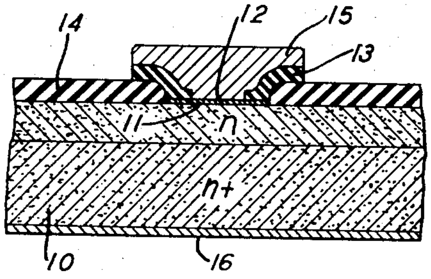
FIGS. 1A and 1B illustrate Schottky barrier devices having a metal-insulator-semiconductor guardring in accordance with the invention.
Figure 1B:
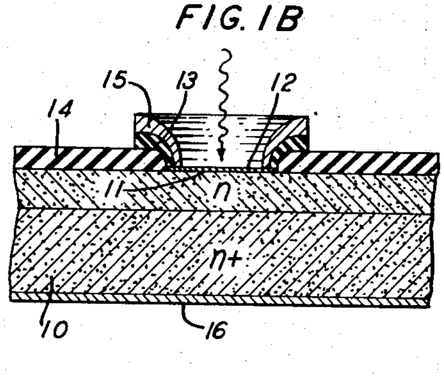

FIGS. 1A and 1B illustrate Schottky barrier devices having a metal-insulator-semiconductor (MIS) guardring in accordance with the invention. FIG. 1A shows a cross section of a Schottky barrier diode having an MIS guardring and FIG. 1B shows a photon detector having an MIS guardring.

The diode of FIG. 1A comprises, in essence, a semiconductor substrate 10, which typically includes an epitaxially formed surface layer, having a thin metal or metal-like layer 11 (typically a few hundred to a few thousand angstroms thick) disposed upon it to form a Schottky metal-to-semiconductor interface 12. In addition, an MIS guardring structure comprising a thin insulating ring 13 (typically 1000 to 10,000 angstroms thick) which circumscribes interface 12 is disposed upon thin metal layer 11. Advantageously, semiconductor surface outside the interface is covered with an insulating layer 14 a few thousand angstroms thick. A relatively thick metal layer 15, typically a few microns thick, is disposed upon the diode structure and adapted to form an electrical contact with thin metal layer 11 and a seal with insulating layer 14. A metal layer 16 completes the diode structure.

A convenient method of constructing this diode comprises the steps of depositing insulating layer 14 on substrate 10, etching an opening in layer 14, producing interface 12 in the opening, and forming guardring 13 around interface 12.

For example, an insulating layer of silicon dioxide a thousand angstroms thick can be formed on a silicon substrate, comprising for example epitaxial $n$ on $n+$ formed by well-known pyrolytic decomposition growth methods. An opening, typically 1 to 50 mils in diameter, can be etched in the oxide by conventional photoetching techniques, and the metal-to-semiconductor interface can be formed on the exposed semiconductor by forming 1000 angstroms of platinum silicide on the exposed semiconductor in the opening in the manner described in the aforementioned article by Kahng and Lepselter. Insulating ring 13 can be formed by depositing a ring of zirconium (2000 angstroms thick) around the edge of the interface and oxidizing it, typically by heating to 350° C. in an oxygen-rich ambient. Additional layers of metal such as titanium and gold can be deposited over the resulting diode structure to serve the multiple functions of providing a metal layer to complete the MIS guardring structure, sealing the diode and providing an electrical contact with the interface.

In operation, the presence of insulating ring 13 prevents any significant leakage current from passing through the edge portion of the interface at reverse bias voltages. In essence, the insulating ring circumscribing the interface edge combined with metal layer 15 and substrate 10, behaves as an MIS structure, producing a concentration of minority carriers in the portion of the semiconductor underlying the interface edge. This concentration prevents leakage from the edge at reverse bias voltages. In other respects, the device operates as a typical Schottky diode.

As previously stated, this MIS guardring reduces the leakage current and increases the reverse breakdown voltage of the diode. This guardring structure is particularly advantageous because it can be produced at a relatively low temperature (approximately 350° after the first and oxidation process), preserving a high quality interface and insuring a long life for the semiconductor. In addition, the MIS structure introduces little additional capacitance into the diode.

FIG. 1B shows a cross section of surface barrier photon or particle detector having an MIS guardring in accordance with the invention. The structure of the device is substantially similar to that of the diode described hereinabove, except that the structure is adapted to permit radiation or particles to penetrate to interface 12. When the particles or photons to be detected have energy which is greater than the semiconductor band gap, metal layer 11 is made sufficiently thin, typically between 50 and 200 angstroms of platinum silicide that the particles or photons can penetrate to interface 12. In addition, second metal layer 15 is formed around the edges of the interface so that thin metal layer 11 is exposed to the particles of photons. Alternatively, when the particle or photon energy is less than the semiconductor band gap but greater than the barrier gap, the semiconductor substrate is made sufficiently thin that the particles or photons can penetrate to the Schottky barrier from the semiconductor side.

In operation, the detector is reverse biased to a voltage near avalanche breakdown and exposed to radiation or particles having sufficient energy to create electron-hole pairs at the interface. Because of the reverse bias voltage, the electrons and holes produce other electron-hole pairs in an avalanche effect, and gain is thus obtained. The carriers produced provide a current which is a measure of the moment of radiation striking the interface.

The guardring reduces the leakage current to a sufficiently small value that the hereinbefore described detector is feasible. It should be noted that detectors using prior art Schottky device can not be made with avalanche gain because the leakage current is too high.

Figure 2A:
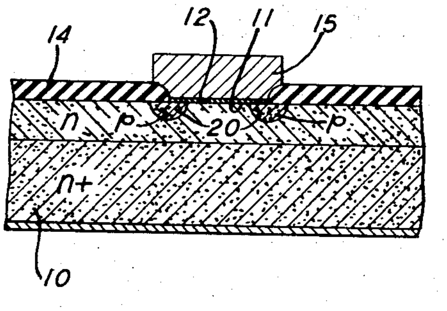
FIGS. 2A and 2B illustrate Schottky barrier devices having a p-n junction guardring in accordance with the invention.
Figure 2B:
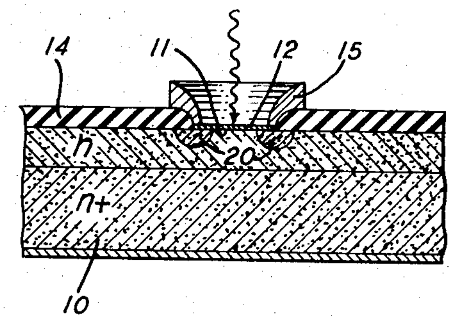

FIGS. 2A and 2B illustrate Schottky barrier devices having a p-n junction guardring in accordance with the invention. FIG. 2A shows a cross section of a Schottky barrier diode having a p-n junction guardring, and FIG. 2B shows particle or photon detector having a similar guardring.

The diode shown in FIG. 2A is similar to that shown in FIG. 1A, except for the absence of the insulating ring (13 of FIG. 1A) and the presence of a p-doped region 20 in the semiconductor circumscribing the edge of the interface. In particular, p-doped ring 20 is adapted to form a p-n junction with the n-doped region of epitaxial substrate 10 around the edge of interface 12. Alternatively, an n-doped region can be used with an epitaxial p on p+ substrate. In this case, however, the metal deposited on the semiconductor to form interface 12 must be one, such as magnesium, having a sufficiently high barrier on p-type material to produce a Schottky barrier.

The diode of FIG. 2A can be conveniently produced by the steps of depositing insulating layer 14 on substrate 10, etching an opening in layer 14, producing p-doped ring 20, and depositing metal layers 11 and 15 to form interface 12 and to seal the structure.

In operation, the presence of the guardring significantly reduces the leakage current of the diode and increases the breakdown voltage. When the device is reverse biased, the p-n junction prevents current from passing through the edge portion of the interface. As a result, the leakage current is reduced by a factor of a thousand to a value so low as two picoamps. The reverse breakdown voltage is increased by a factor of two or three. When, on the other hand, the device is forward biased, it acts as a conducting Schottky diode.

In addition to their high reverse-breakdown voltages, these diodes have a nearly ideal current-voltage characteristic in both forward and reverse bias. Thus they are especially useful as logarithmic converters. On these diodes, a logarithmic current-voltage relationship holds for current values ranging from a picoamp to a tenth of a milliamp—a range four orders of magnitude greater than that of typical p-n junction converters.

The structure of the detector shown in FIG. 2B is substantially the same as that of the diode described in connection with FIG. 2A. The primary difference is that the structure is adapted to permit radiation or particles to penetrate to interface 12. When the particles or photons to be detected have energy which is greater than the semiconductor band gap, metal layer 11 is made sufficiently thin that the particles or photons can penetrate to interface 12. In addition, second metal layer 15 is formed around the edges of the interface so that thin metal layer 11 is exposed to the particles or photons. Alternatively, when the particle or photon energy is less than the semiconductor band gap, but greater than the barrier gap, the semiconductor substrate is made sufficiently thin that the particles or photons can penetrate to the Schottky barrier from the semiconductor side. The operation and advantages of this detector are substantially the same as those described in connection with the detector shown in FIG. 1B.

Figure 3:
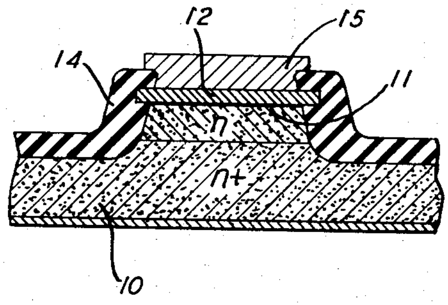
FIG. 3 illustrates a Schottky barrier diode having a closure guardring in accordance with the invention.

FIG. 3 is a cross sectional illustration of a surface barrier diode having a closure guardring in accordance with the invention. The diode comprises semiconductor substrate 10 having a metal-to-semiconductor interface 12 and a closure guardring circumscribing the edge of the metal layer forming the interface. More specifically, the closure guardring comprises an insulating layer 14 which surrounds the edge of the metal layer.

The closure guardring structure can be conveniently fabricated by depositing a first thin metal layer on the semiconductor to form the interface, selectively etching away the semiconductor around the edge of the metal, and forming an insulator around the edge. The latter step, for example, can be accomplished by depositing a zirconium layer, covering the center of the interface with a metal which does not oxidize, and oxidizing the exposed zirconium to form the insulating closure ring. In operation, the device operates much like a conventional Schottky barrier diode, however the metal edge has been removed from the electrical system.

In all cases it is understood that the above-described arrangements are illustrative of a small number of the many possible specific embodiments which can represent applications of the principles of the present invention. For example, other metal-to-semiconductor interfaces such as germanium-to-palladium and gallium arsenide-to-gold can be used to form the Schottky barrier. In addition, other materials such as $Si_3N_4$, and $Al_2O_3$ can be used to form the insulating layer. Thus, it can be seen that numerous and varied other arrangements can be readily devised in accordance with these principles by those skilled in the art without departing from the spirit and scope of the invention.

What is claimed is:

1. A semiconductor device which comprises:
   (a) a semiconductive layer;
   (b) a first insulating layer disposed on a surface of the semiconductive layer and having an aperture including therein a surface portion of the semiconductive layer entirely of a single conductivity type;
   (c) a metal-like layer physically contacting said surface portion and forming a Schottky barrier connection thereto over said surface portion;
   (d) a second annular insulating layer in physical contact with both said metal-like layer and said first insulating layer, the second annular insulating layer overlying the entire edge of the Schottky barrier connection; and (e) a metal electrode overlying the second insulating layer and contacting the metal-like layer over regions removed from the edge of the Schottky barrier connection.

2. A semiconductor device in accordance with claim 1 in which the semiconductive layer is silicon and the first insulating layer is silicon dioxide.

3. A semiconductor device in accordance with claim 2 in which the second insulating layer is zirconium oxide.

4. The device recited in claim 3 in which the metal-like material is essentially platinum silicide.

5. The device recited in claim 1 in which the metal-like material is palladium and the semiconductor is germanium.

6. The device recited in claim 1 in which the metal-like material is gold and the semiconductor is gallium arsenide.

7. The device recited in claim 1 in which the second insulating layer has a thickness in the range of about 1000 to 10,000 angstroms.

8. The device recited in claim 7 in which the second insulating layer is zirconium oxide.

References Cited

UNITED STATES PATENTS

| | | | |
|---|---|---|---|
| 3,405,329 | 10/1968 | Loro et al. ---------- | 317—234 |
| 3,463,971 | 8/1969 | Soshea et al. -------- | 317—234 |

JOHN W. HUCKERT, Primary Examiner

MARTIN E. EDLOW, Assistant Examiner

U.S. Cl. X.R.

117—212; 148—175